United States Patent
Bertilsson et al.

[11] Patent Number: 5,889,650
[45] Date of Patent: Mar. 30, 1999

[54] STAND ARRANGEMENT

[75] Inventors: Lars Yngve Bertilsson, Stockholm; Lars Göran Nygren, Tumba; Jan Roger Wennerberg, Nynäshamn, all of Sweden

[73] Assignee: Telefonaktiebolaget LM Ericsson, Stockholm, Sweden

[21] Appl. No.: 930,010

[22] PCT Filed: Apr. 12, 1996

[86] PCT No.: PCT/SE96/00477

§ 371 Date: Oct. 15, 1997

§ 102(e) Date: Oct. 15, 1997

[87] PCT Pub. No.: WO96/33598

PCT Pub. Date: Oct. 24, 1996

[30] Foreign Application Priority Data

Apr. 20, 1995 [SE] Sweden ................................ 9501456

[51] Int. Cl.⁶ .................................................. H05H 7/20
[52] U.S. Cl. ........................................ 361/690; 361/610
[58] Field of Search ..................... 361/610, 688, 361/690, 695–696, 725–727; 379/328, 329

[56] References Cited

U.S. PATENT DOCUMENTS

| | | |
|---|---|---|
| 2,857,558 | 8/1958 | Fiske . |
| 4,530,632 | 7/1985 | Perry, II .................................. 361/610 |
| 4,871,324 | 10/1989 | Brune et al. ............................ 439/189 |
| 5,234,348 | 8/1993 | Konsevich et al. . |
| 5,245,527 | 9/1993 | Duff et al. ............................... 361/610 |
| 5,325,270 | 6/1994 | Wenger et al. . |

FOREIGN PATENT DOCUMENTS

| | | |
|---|---|---|
| 2209858 A | 4/1973 | Germany . |
| 3608046 C3 | 11/1991 | Germany . |
| 1299568 A1 | 3/1987 | U.S.S.R. . |

*Primary Examiner*—Gregory Thompson
*Attorney, Agent, or Firm*—Burns, Doane, Swecker & Mathis, L.L.P.

[57] ABSTRACT

A rack arrangement including a rack designed to be able to support several magazines that are positioned above one another, where each magazine encloses several printed boards or printed board assemblies that are situated side by side. The frontal surface of the rack arrangement coincides with the front plane of each magazine. Cassettes designed to control or guide a flow of air for cooling the printed boards is arranged between adjacent magazines at a vertical distance from one another. The magazine and/or the cassette is arranged so that, from a fully-inserted position in the rack, the magazine and/or cassette may be displaced along guides to project beyond the rack, or vice versa. A magazine and adjacent cassette may be joined together by a hinge along a horizontal edge of the front plane. When displaced, the magazine may be dropped or tilted forwardly by the hinge, thereby making the back plane accessible.

9 Claims, 3 Drawing Sheets

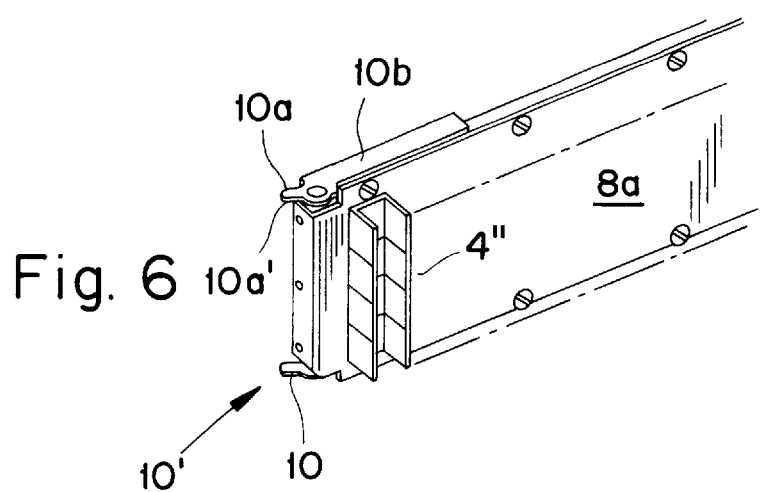
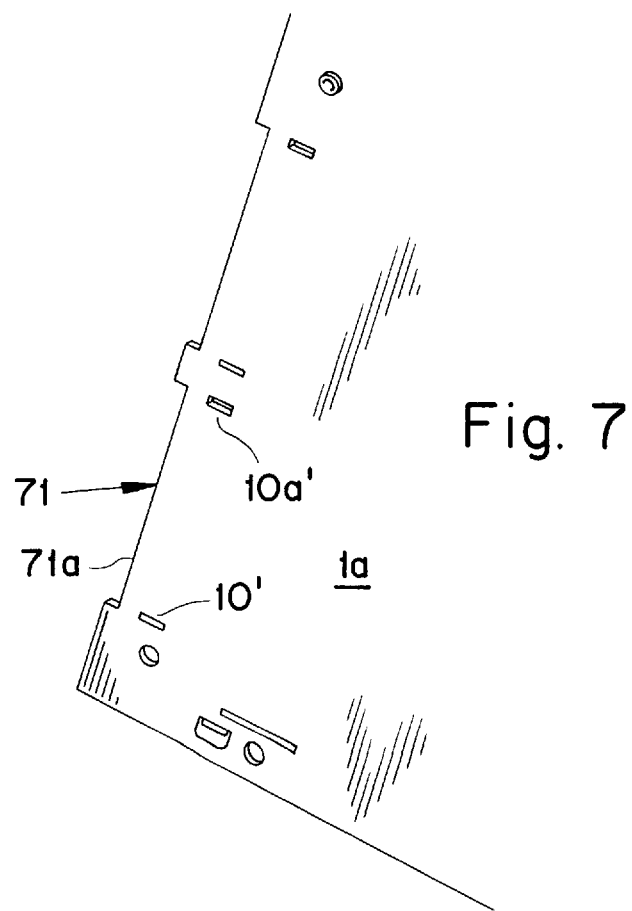

STAND ARRANGEMENT

TECHNICAL FIELD

The present invention relates to a stand or rack arrangement, and more particularly, to such a rack arrangement that is designed and adapted for use in telecommunications systems.

A rack arrangement, that exhibits the basic characteristics of the present invention, uses a framework or a rack, adapted to be able to support several magazines that are positioned above one another, whereby each magazine encloses several printed boards or printed board assemblies that are related or situated side by side.

Further, a frontal surface of the rack arrangement must be able to coincide, or appreciably or essentially coincide, with a front plane of each magazine.

In addition, an edge section for each printed board or printed board assembly shows boardrelated connectors, designed for a firm but easily removable interaction with corresponding connectors, related to the back plane of the magazine.

Means or cassettes, which are designed to control a flow of air intended to cool at least printed boards or printed board assemblies, are arranged between adjacent magazines and at a vertical distance from one another. The magazine and/or the means is arranged so that, from a fully inserted position in the rack, the magazine and/or means may be displaced, along guides that are mounted in the rack, to project beyond the rack, or vice versa.

DESCRIPTION OF THE BACKGROUND ART

Printed boards are used within telecommunications systems and boards of this kind contain electrical conductors or wires that have been run or arranged by using layers of electrically-conducting foil and by arranging a number of foils above eachother, each foil separated by an intermediate layer of electrically-insulating foil, and by arranging required connections between the electrical foils.

When discrete components are mounted on one or both sides of such a printed board, then such an arrangement is called a printed board assembly.

However, in the description that follows we have used the term "printed board" to apply to both categories.

Printed boards of this kind, and for the application described above, require an electrical interaction with each other and therefore several printed boards are mechanically supported by a magazine. By means of electrical conductors via a back plane of the magazine said printed boards may electrically be interacted or interconnected with one another.

The printed boards are equipped with edge-related connectors or contact means, and the back plane of the magazine is equipped with corresponding connectors or contact means.

The connectors that belong to the printed boards are arranged to be able to interact with connectors that belong to the magazine. These connectors are coordinated in rows to the back plane.

Ordinarily, the back plane for magazines of this kind supports only required electrical conductors; that is the conductors that are required to connect the printed boards functionally to one another.

It is a known practice to use a rack arrangement that is designed to be able to hold several magazines, ordinarily positioned above one another, at a vertical distance from one another.

Rack arrangements, of the kind described above, have existed in numerous different embodiments. A common feature for one category of these rack arrangements is that the magazines can, via guides, be horizontally displaced from a fully-inserted position in the rack to a position that projects beyond the rack, and vice versa, thereby making the printed boards or the printed board assemblies that belong to the magazine more accessible for inspection or for replacement.

One or more printed boards might be replaced partly when a printed board malfunctions partly when the function has been modified in a way that requires a new printed board.

It is common for rack arrangements of this kind to interact with several magazines, each of which is equipped with a fixed back plane that has connectors positioned in columns or rows, and where the back plane in addition thereto is equipped with required bus arrangements and other electrical conductors or wires.

As an example of the prior art, we refer to the Patent Publication U.S. Pat. No. 4,871,324, which shows and describes a back plane with several connectors that were arranged in parallel columns, one beside the other.

Another known practice involves arranging "flexible" back planes.

As an example of the prior art, we refer to the content of the Patent Publication U.S. Pat. No. 5,325,270, which shows a flexible back plane arrangement that uses removable back plane modules that were mounted on a platform that enabled the back plane modules to be removed and exchanged with other types of circuit modules.

In this publication it shows that the magazine (10) has two contact groups (20U, 20L), in which the conductors or wires of one group (20U) are fixed, whereas the second group, the lower group (20L), makes up by a part of a detachable back plane module (22).

The back plane module (22) may glide in relation to a track (44).

The Patent Publication U.S. Pat. No. 5,234,348 also shows a back plane for interacting with several electronic components, where the back plane is inserted into a rack, that may be installed onboard a vehicle; for example an aeroplane.

Here is shown a detachable frame to which electronic components are mounted. Without having to dismount the rack from the vehicle, one simply removes the frame to obtain complete access to the back plane and connections for various components.

The contents of the following publications also relate to the background art: DE-C3-3 608 046; U.S. Pat. No. 2,857, 558; DE-A-2 209 858; and SU-A1-1 299 568.

SUMMARY OF THE INVENTION

TECHNICAL PROBLEMS

Considering the prior art, as it has been described above, it ought to be considered as a technical problem related to a rack arrangement of the kind described above, to be able, by simple means and without detracting from an easy access to printed boards and printed board assemblies, to create conditions whereby the back plane that belongs to a magazine, can easily be exchanged and modified.

Another technical problem is in being able to realise the importance of dividing the back plane into several subsections that extend or stretch across the used printed boards.

Another technical problem is in being able to realise the significance of being able to apply active components to one or more subsections.

Another technical problem, related to a rack arrangement of the kind described above, is in being able to create conditions where long signal paths, which would otherwise be required, could be reduced, thereby making it possible to establish a high rate of signal transfer.

Yet another technical problem is in being able to realise the significance of and the benefits associated with, reducing the number of make contacts or contact bridges in a signal path.

Another technical problem is in being able to cause or arrange a magazine that is considered to be capable of solving one or more of the above technical problems by arranging the back plane so that it can be divided, and by allowing one or more of these easily exchangeable subsections to contain active components. Moreover, it should be possible to remove or to insert a subsection without disturbing or changing the printed board assemblies in the magazine.

Another technical problem is in being able to realise the opportunities that exist when some of the subsections in the back plane are caused redundant, meaning that such a subsection can be exchanged or replaced without disrupting current operations.

In a rack arrangement of the kind described above another technical problem is in being able to realise the significance of combining a magazine with an adjacent, underordinate means or cassette, in order to form a unit that can be inserted or removed via guides, that interact with the means or the cassette.

Another technical problem is in being able to realise the significance of joining the magazine and the means with a hinge or similar device along a horizontal edge of the front plane, and of allowing the lower edge section of the magazine to rest against the upper edge section of said means.

Still another technical problem is in being able to realise the significance of designing the length of displacement that is shared by the magazine and the means so that the back plane of the magazine is free of the rack's frontal surface, allowing it to be dropped or tilted forward by means of the hinge. Thus, the back plane is accessible for inspection, and facilitates the easy exchange of one or more subsections of the magazine's back plane, where one or more of these subsections can show a number of connectors or connector means that are coordinated to contact strips.

Yet another technical problem is in being able to create conditions whereby the back plane may consist of a number of adjacent subsections that stretch or extend across the printed board, where each subsection is equipped with connectors or connector means, coordinated to contact strips and with said subsection affixed to the magazine with an easily removable fastener, via end-related lever arrangements.

Another technical problem is in being able to show a lever arrangement that, in a first state, allows the contact strips for the subsections to be pre-positioned relative to the contact strips of the printed boards, through end-related edge sections, and that in a second state allows an additional, more precise pre-positioning of the contact strips of the subsection through paired, end-related projections, that are designed to interact with guiding tracks of the rack, thereby aligning the contact strips in the subsection in an initial state that is co-positioned with the contact strips of the printed board.

Still another technical problem is in being able to create conditions whereby the lever arrangement's terminating movement for the connectors will bring them to a final interaction, whereby the pattern of movement is chiefly or primarily determined by the complementary shape of the connectors.

Another technical problem is in being able to create a simple lever arrangement in each end section of each subsection for the back plane, in order to create conditions whereby an equal, shared influence from the end-related lever arrangements can cause corresponding connectors, which are coordinated to opposing contact strips, to interact. The control required for this interaction may be assumed or caused by the design of the connectors.

Another technical problem is in being able to realise the range of angles or values within which each magazine must be arranged to revolve or tilt, in order to provide easy access to each of the subsections of the back plane, without having an injurious effect on magazine-related connecting cables for said printed boards.

It ought to be considered as a technical problem to be able to realise the significance of, and the benefits that are associated with, a particular orientation of connecting cables for printed boards that belong to the magazine, relative to a cable chute that belongs to the means.

SOLUTION

In order to solve one or more of the above technical problems, the present invention proceeds or originates from a rack arrangement;

whose rack is designed to be able to support several magazines that are positioned above one another, where each magazine encloses several printed boards or printed board assemblies that are situated side by side;

whose frontal surface coincides, or appreciably or essentially coincides, with the front plane of each magazine;

wherein at least one edge section for each printed board shows connectors or contact means that are coordinated to one or more contact strips, designed for a firm but easily removable interaction with corresponding connectors or contact means, coordinated to one or more contact strips, relative to the back plane of each magazine;

that contains means or cassettes, which are designed to control a flow of air for cooling at least said printed boards and the like, arranged between adjacent magazines and at a horizontal distance from one another;

whose magazine and/or means is arranged so that, from a fully-inserted position in the rack, the magazine and/or means may be displaced along guides to project beyond the rack, or vice versa.

In a rack arrangement of this kind, the present invention reveals or discloses that at least one magazine and an adjacent, underordinate means are connected to each other by a hinge or comparable means that may revolve or swing along a horizontal edge of the front plane; that solely said means is arranged to interact with said guides; that the guides and said means interact to displace a magazine far enough away from the rack that the back plane of the magazine can be positioned to coincide, or to appreciably or essentially coincide, with the fontal surface of the rack arrangement, and that in this position the magazine may be dropped or tilted forward by means of the hinge, thereby making the back plane accessible.

Proposed embodiments, as they fall within the scope of inventive idea, show that the back plane of said magazines must consist of several closely-aligned, easily-removable, contact strip-bearing subsections, that are firmly attached to but easily removable from the magazine via end-related level arrangements.

Further, the invention shows that each of the lever arrangements for a subsection is made up of two projections, designed to provide a supporting function and to interact with tracks of the rack, a hoop, and a revolving axel.

The invention shows, in an initial interaction between said projection and said tracks, that said end-related paired projections and said tracks must be designed to orient, in an initial state, the subsection to a corresponding co-positioned connection, after which an equal shared influence from the end-related lever arrangement may bring said connectors to interact completely.

Further, the invention shows that the magazine is arranged to be able to turn or revolve, relative to the means, about the hinge, more than 35 degrees, for example, 45 degrees, but generally less than 80 degrees.

The invention also shows that magazine-related connection cables, that belong to printed boards, must be arranged to angle towards a cable chute that belongs to a given means. The cables are then angled to run alongside the cable chute. Finally, the cables are angled towards the rack, and are affixed in part to the cable chute, and in part to the rack.

ADVANTAGES

According to the present invention, the prime advantage associated with a rack arrangement is that conditions are created for providing a simple way of exchanging one or more subsections that make up the back plane of a magazine, all the while maintaining the flexibility that is required, in terms of inspections or for exchanging printed boards and printed board assemblies, for a rack arrangement. This is possible only after first having realised that the back plane must consist of several subsections positioned in parallel, and second by creating conditions whereby, via end-related level arrangements, said firmly-attached but easily removable subsections may be related to the magazine and, by means of a hinge, being able to revolve or swing the magazine in a displaced state away from the rack, thereby making the back plane freely accessible for inspections and for exchanging one or more subsections.

Moreover, it is possible to allocate discrete components and/or other circuit arrangements and functions to one or more subsections, thereby enabling an expansion or a simple modification of the functions that are used.

According to the present invention, the primary characteristic features for a rack arrangement are set forth in the characterizing clause of claim 1.

BRIEF DESCRIPTION OF THE DRAWINGS

A currently proposed embodiment, which shows the most significant characteristic features associated with the current invention, will be described in greater detail with reference to the accompanying drawings, in which:

FIG. 6 shows the lever arrangement described in FIG. 5 in an assembled state and in a final state, where corresponding connector means interact with one another; and FIG. 7 shows in perspective view, one of the magazine's side planes, in order to show that some parts interact with a lever arrangement.

DESCRIPTION OF EMBODIMENTS AT PRESENT PREFERRED

Figure 1:
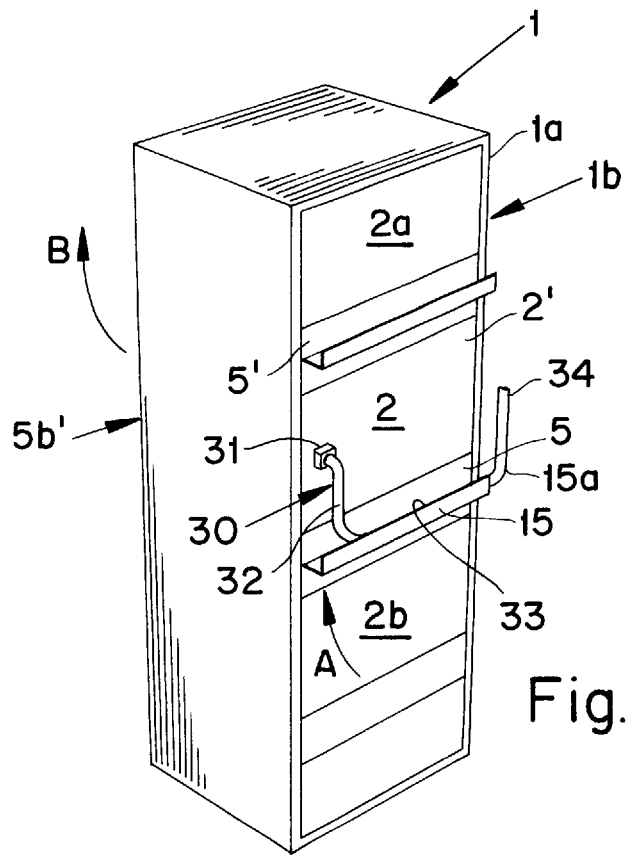
FIG. 1 shows in a perspective view a rack arrangement with three magazines fully inserted into the rack.

Referring to FIG. 1 said figure shows in perspective view, a rack arrangement 1, with a framework or rack 1a that is designed to be able to support several magazines that are positioned above one another. The exemplifying embodiment illustrates three magazines 2, 2a, and 2b, where the magazine 2 is situated in the middle.

Inasmuch as the magazines 2, 2a, and 2b are identical, the following description will only touch on the magazine 2.

Figure 2:
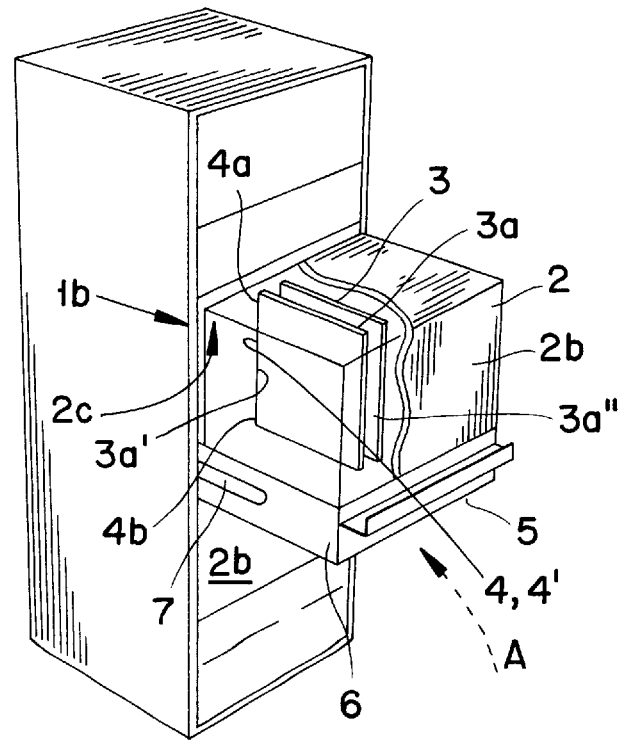
FIG. 2 shows the rack arrangement, described in FIG. 1, where a magazine positioned in the middle, together with a subordinate and under related means or cassette, is displaced from, and free of, the rack.

Although each of these magazines encloses several printed boards and printed board assemblies, FIG. 2 shows only two printed boards 3, 3a, which are related to, or are positioned adjacent to, the frontal surface 1b of a rack arrangement that coincides, or that appreciably or essentially coincides, with the frontal surface 2' of each magazine 2 when the magazines are fully inserted into the rack, as shown in FIG. 1.

An edge section 3a' for each printed board 3a shows a number of connectors or connector means, which are shown to be coordinated to several contact strips.

The number of contact strips 4, 4a, 4b is chosen to correspond with the number of subsections for a back plane of the magazine.

Although the illustrated embodiment shows only three subsections, the invention is not limited to this number. Indeed, four subsections might be more practical, since it would then be possible to use paired redundant subsections, in which case two subsections could be exchanged during current operation without causing disruptions in the function.

Each of the contact strips 4, 4a, 4b and associated connectors are designed to interact in a known way, providing a firm but easily removable connection with corresponding connectors. This illustration shows the connectors coordinated to several contact strips, one contact strip for each subsection.

Each subsection 8, that belongs to a complete back plane 2c, is equipped with several parallel contact strips, oriented to cross the longitudinal reach of the subsection 8, and able to interact with corresponding like-positioned contact strips for each of the printed boards (3, 3a).

As indicated above, although the exemplifying embodiment shows that a complete back plane may be made up of three subsections 8, 8a, 8b, in the practical application the number of subsections 8, 8a, 8b used may be fewer or greater than three. Similarly, the subsections may be wider or thinner than shown here.

Likewise, one or more printed boards, as well as one or more subsections, may not have a contact strip for connecting to a connector means.

A means or a cassette 5 is arranged between adjacent magazines, for example, the magazine 2 and the magazine 2b, that are vertically separated from one another.

According to the invention, a magazine, for example the magazine 2, and a subordinate or under-related means or cassette, for example, the means 5, must be coordinated to a unit, meaning that the magazine 2 and the means 5 must be able to enter a shared state fully inserted (FIG. 1) in the rack arrangement 1, or a shared state displaced beyond the rack arrangement (FIG. 2).

Figure 3:
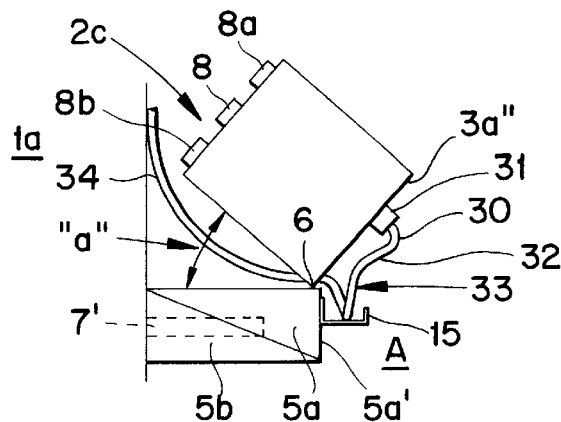
FIG. 3 shows in a side view the magazine after it has been dropped or tilted forward relative to the means making the back plane accessible.

The means 5 is, as FIGS. 2 and 3 show in greater detail, divided into two canals. One canal 5a is adapted to guide a flow of air "A", whose purpose is to cool, passing through an opening 5a', through the canal 5a, up between the printed boards 3, 3a, and finally guided by a subordinate above-related means 5' through a canal 5b' (which corresponds to canals 5b) out at the back of the rack arrangement 1, as a warmed or heated flow of air "B", when the magazine 2 and the means 5 enter the state illustrated by FIG. 1.

The present invention shows that a magazine 2 and an adjacent subordinate under-related means 5 are used when these, via a hinge 6 or similar revolvable or tiltable means, are joined in order to swing, or to be dropped or tilted forward, along a horizontal, front-related edge, thereby forming a unit.

Solely the means 5 is arranged to be able to interact with opposing guides 7, 7'. Moreover, said guides 7, 7' and means 5 interact to displace the magazine 2 far enough away from the frontal surface 1b of the rack arrangement that the back plane 2c of the magazine can be brought to coincide, or appreciably coincide, with the frontal surface 1b of the rack arrangement.

In this position, which is best illustrated by FIG. 3, the magazine is free to be dropped or tilted forward by means of the hinge 6, thereby making the back plane 2c and each of the subsections 8, 8a, 8b easily accessible for inspection and/or for exchange in the event that they malfunction or that their functions need to be modified.

Within the scope of the invention, it is possible to permit one or more subsections, for example, the subsection 8, to be constructed to solely contain electrical conductors such as a bus arrangement, and to permit one or more subsections, for example, the subsection 8a, to be constructed to contain not only electrical conductors, but also to be able to support active components, such as discrete components.

Thus, by merely exchanging one or more subsections that contain various functions, it is possible to alter the pattern of functions for the printed boards in use.

In a telephone exchange in particular, it is possible to place a switch core in one of the subsections, with a redundant switch core in another, in which case the signal paths are shortened and need only pass via one connector means.

Said magazine-related back plane 2c consists of several easy-to-mount and easy-to-remove adjacent subsections 8, 8a, 8b, that are affixed to the magazine and to the printed boards 3, 3a via similarly-designed end-related lever arrangements, where the lever arrangements 9 and 9a are shown allocated to the subsection 8a.

Figure 4:
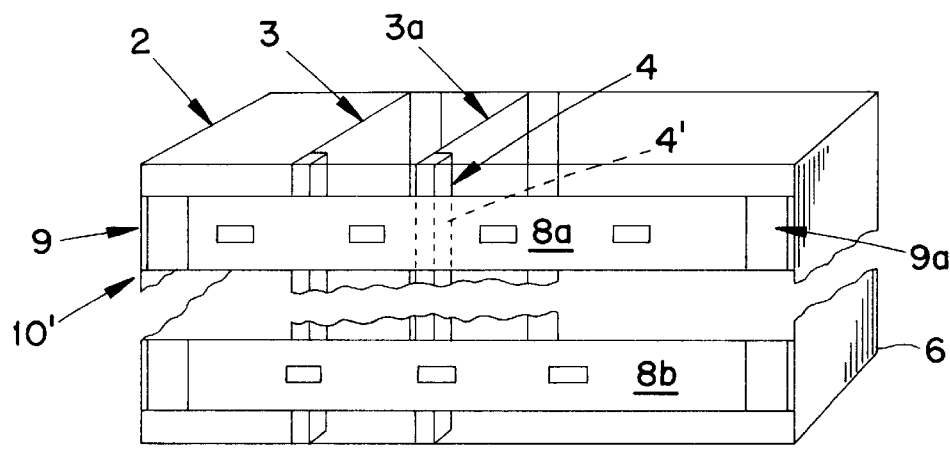
FIG. 4 shows in perspective view and in a schematic drawing part of a magazine from an angle that exposes the back plane.

Note: the subsection 8a shows several parallel, vertically-oriented connector means, coordinated to contact strips, one of which is identified as 4' in FIG 4.

Contact strips of this kind for a subsection may be available for each printed board or solely for selected printed boards.

Contact strips for an adjacent subsection may be available for each printed board or solely for selected printed boards.

Figure 5:
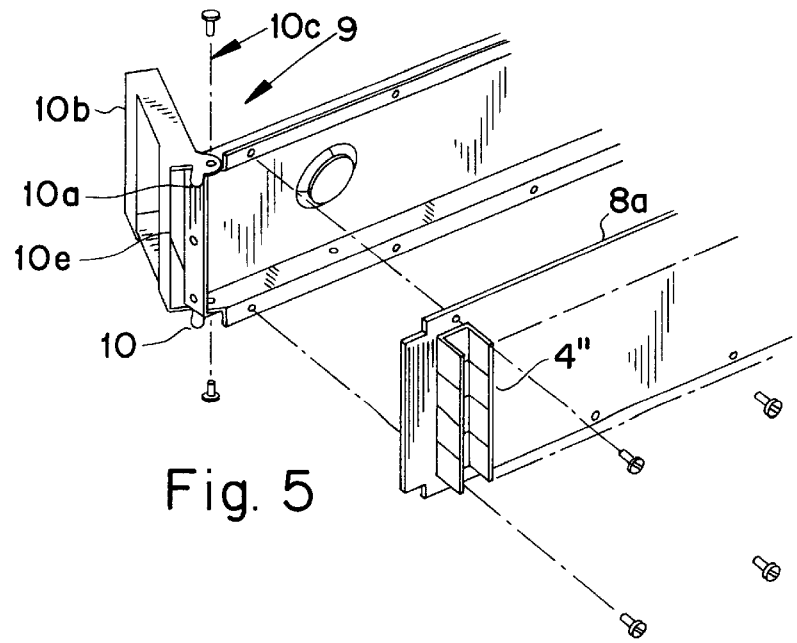
FIG. 5 shows in an exploded view a lever arrangement in a first state, ready to interact (initial interaction) with the rack (adapted state)

Because the two lever arrangements 9, 9a are identical, we will describe only lever arrangement 9 in greater detail with reference to FIGS. 5 and 6.

A lever arrangement for a subsection 8a shows two projections 10, 10a, adapted to support and to interact with rack-related tracks 10', 10a', a loop 10b, and a revolving axel 10c.

The tracks 10', 10a' form an end section of the magazine, and are situated adjacent to an outlet 71.

In a first initial state, in order to align corresponding connectors means, a surface or an edge 10e must strike against an edge 71a. This holds true for both lever arrangements.

In a second initial state, in order to more precisely align corresponding connectors means, the projections 10, 10a must be brought to interact with the tracks 10', 10a', whose shape is characterized by an embossing having rounded edges for guiding the projections 10, 10a into the tracks 10', 10a'.

Said paired projections 10, 10a are hereby adapted to initially orient the contact strip 8a in an initially like-oriented state in the connector means. By means of a shared, equal influence from the end-related lever arrangements 9, 9a and its related hoops 10b, the corresponding connector means (4" in FIGS. 5 and 6) are brought to interact with one another.

With additional reference to FIG. 3 this figure shows that the magazine is arranged to be able to revolve or tilt at an angle "a" that is at least 45 degrees, and generally less than 80 degrees.

The angle of rotation may be less for printed board assemblies and magazines that have a small depth and a large height.

A minor revolving or tilting movement affects the cables only slightly, but makes it difficult to exchange the subsections, especially the one that are located adjacent the bottom.

The connection cables, that belong to the printed board, of which one is designated the reference numeral 30, are affixed via a connector 31, relative to an edge section 3a" of a printed board. The cables angle through a section 32 and run to a cable chute 15 for the means 5. They also angle through a section 33, and run along the cable chute 15. Thereafter, they angle through a section 34 and run to the rack arrangement 1, to which the cable is attached in a known way.

The cables are firmly attached to the cable chute 15 at the end section 15a, and run in a "loop" to a rack-related mount.

The invention shows that it is possible to allocate one or more or only parts of signal-handling units to the back plane 2c by using one or more subsections 8, 8a, 8b to support said units.

In particular, the signalling units or blocks, which execute large amounts of information between different printed boards, should be situated in the back plane and divided amongst selected subsections.

If functions or part-functions are to the back plane, then simpler functions or part functions can be provided by functions of the printed boards, and a selected upgrade can take place in the back plane and/or in the printed boards.

Moreover, it is possible by using several parallel subsections in the back plane and with an error-tolerant system, then it would be possible for a subsection to be removed and exchanged without affecting the function of the system.

Known means per se can be used to limit the movement and to lock the cassette in an upright state.

Obviously, the invention is not limited to the above illustrated exemplifying embodiments. Modifications can be made within the scope of inventive idea or thought as illustrated in the following claims.

We claim:

1. A rack arrangement comprising:

a rack capable of supporting a plurality of magazines that are positioned above one another, each of said plurality of magazines enclosing several printed boards or printed board assemblies that are situated in a side-by-side relation, a frontal surface of said rack essentially coinciding with a front plane of each said magazine, wherein at least one edge section for each printed board or printed board assembly includes connectors or connector means designed for a firm but easily removable interaction with corresponding connectors or connector means related to a back plane of each said magazine, wherein each of said plurality of magazines contains a means designed to guide a flow of air for cooling the printed board or printed board assemblies, said cooling air guiding means being arranged between adjacent magazines at a vertical distance from one another;

at least one of said magazine and said associated cooling air guiding means is arranged so that, from a fully-inserted position in the rack, said at least one of said magazine and said associated cooling air guiding means may be displaced along guides to project beyond the rack, wherein at least one said magazine and an adjacent said cooling air guiding means are connected to each other by a hinge means that may swing along a horizontal edge of the front plane of said at least one said magazine; said cooling air guiding means being arranged to interact with said guides, such that said guides and said cooling air guiding means interact to displace said at least one said magazine far enough away from said rack that the back plane of the magazine can be positioned to essentially coincide with the frontal surface of the rack such that in this position said at least one said magazine may be dropped or tilted forward by means of said hinge, thereby making the back plane of said at least one said magazine accessible.

2. An arrangement according to claim 1, wherein said back plane of each said magazine comprises several closely-aligned subsections removably attached to each said respective magazine via lever arrangements.

3. An arrangement according to claim 2, wherein the lever arrangements for one of the subsections includes two projections designed to provide support and to interact with tracks of the rack, a hoop, and a revolving axle.

4. An arrangement according to claim 3, wherein said two projections are designed to orient the connectors or connector means in an initial position, and an equal, shared influence from the lever arrangements brings said connectors or connector means to interact completely.

5. An arrangement according to claim 1, wherein each said magazine is arranged to be able to revolve at an angle that exceeds about 45 degrees relative to the cooling air guiding means about the hinge.

6. An arrangement according to claim 1, wherein each said magazine is arranged to revolve at an angle that is less than 80 degrees relative to the cooling air guiding means about the hinge.

7. An arrangement according to claim 1, wherein connection cables associated with the printed board or the printed board assembly are arranged to angle towards a cable chute for the cooling air guiding means, thereafter being arranged to angle for running alongside the cable chute, and finally to angle towards the rack.

8. An arrangement according to claim 5, wherein each said magazine is arranged to revolve at an angle that is less than 80 degrees relative to the cooling air guiding means about the hinge.

9. A rack arrangement comprising:

a rack having a frontal surface;

a plurality of magazines supported in said rack, said magazines being positioned above one another, each of said magazines enclosing a plurality of printed boards or printed board assemblies that are situated in a side-by-side orientation, and each of said magazines including a front plane and a back plane;

said frontal surface of said rack being substantially in alignment with said front planes of said magazines;

each of said plurality of magazines including an associated means for guiding a flow of air for cooling the enclosed printed boards or printed board assemblies, each said magazine and associated said cooling means defining a rack subsection;

each said rack subsection including at least one of said magazine and said associated cooling means being arranged so that, from a fully-inserted position in the rack, one of said magazine and said associated cooling means may be displaced along guide members to project beyond said frontal surface of said rack, each said magazine and associated said cooling means being connected to each other by a hinge that turns along a horizontal edge of the front plane said respective magazine, and said cooling means being arranged to interact with said guide members whereby said magazine may be displaced far enough away from said rack such that said back plane of said magazine can be positioned substantially aligned with said frontal surface of the rack; and wherein said back plane of said magazine is thereby accessible by dropping or tilting said magazine about said hinge.

\* \* \* \* \*